US008884291B2

(12) United States Patent
Kang et al.

(10) Patent No.: US 8,884,291 B2
(45) Date of Patent: Nov. 11, 2014

(54) THIN FILM TRANSISTOR DISPLAY PANEL AND MANUFACTURING METHOD THEREOF

(75) Inventors: Su-Hyoung Kang, Bucheon-si (KR); Yoon Ho Khang, Yongin-si (KR); Dong Jo Kim, Yongin-si (KR); Hyun Jae Na, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 72 days.

(21) Appl. No.: 13/172,200

(22) Filed: Jun. 29, 2011

(65) Prior Publication Data

US 2012/0223300 A1 Sep. 6, 2012

(30) Foreign Application Priority Data

Mar. 2, 2011 (KR) ........................ 10-2011-0018422

(51) Int. Cl.
*H01L 29/04* (2006.01)
*H01L 29/786* (2006.01)
*H01L 29/417* (2006.01)
*H01L 29/45* (2006.01)

(52) U.S. Cl.
CPC ...... *H01L 29/7869* (2013.01); *H01L 29/41733* (2013.01); *H01L 29/45* (2013.01); *H01L 29/78606* (2013.01)
USPC .................. 257/59; 257/43; 257/72; 257/258

(58) Field of Classification Search
CPC ..................... H01L 29/7869; H01L 29/78618; H01L 27/1214; H01L 27/1225
USPC ....................... 257/59, 72, 258, 43
See application file for complete search history.

(56) References Cited

U.S. PATENT DOCUMENTS

| 7,507,991 B2* | 3/2009 | Zhang et al. ................. 257/59 |
| 2006/0223210 A1* | 10/2006 | Choi ............................... 438/30 |
| 2007/0087616 A1* | 4/2007 | Sakakura et al. ............ 439/395 |
| 2009/0032819 A1* | 2/2009 | Lim et al. ...................... 257/72 |
| 2009/0305461 A1* | 12/2009 | Akimoto et al. ............. 438/104 |
| 2010/0134742 A1* | 6/2010 | Kim et al. .................... 349/141 |
| 2010/0155719 A1 | 6/2010 | Sakata et al. |

FOREIGN PATENT DOCUMENTS

| JP | 2010-004000 | 1/2010 |
| JP | 2010-123932 | 6/2010 |
| JP | 2010-243594 | 10/2010 |

(Continued)

*Primary Examiner* — Tan N Tran
(74) *Attorney, Agent, or Firm* — H.C. Park & Associates, PLC

(57) ABSTRACT

A thin film transistor array panel and a manufacturing method capable of forming an insulating layer made of different materials for a portion contacting an oxide semiconductor and a second portion without an additional process. The thin film transistor array panel includes: a gate electrode; a source electrode and a drain electrode spaced apart from each other, each of the source and drain electrodes comprising a lower layer and an upper layer; an insulating layer disposed between the gate electrode and the source and drain electrodes; a semiconductor, the source electrode and the drain electrode being electrically connected to the semiconductor; a first passivation layer contacting the lower layer of the source and drain electrodes but not contacting the upper layer of the source and drain electrodes; and a second passivation layer disposed on the upper layer of the source and drain electrodes. The first passivation layer may be made of silicon oxide, and the second passivation may be made of silicon nitride.

30 Claims, 14 Drawing Sheets

(56) References Cited

FOREIGN PATENT DOCUMENTS

| JP | 2010-245118 | 10/2010 |
|---|---|---|
| KR | 1020100002899 | 1/2010 |
| KR | 1020100040603 | 4/2010 |
| KR | 1020100059586 | 6/2010 |
| KR | 1020100059587 | 6/2010 |
| KR | 1020100070082 | 6/2010 |

* cited by examiner

THIN FILM TRANSISTOR DISPLAY PANEL AND MANUFACTURING METHOD THEREOF

CROSS-REFERENCE TO RELATED APPLICATION

This application claims priority to and the benefit of Korean Patent Application No. 10-2011-0018422, filed on Mar. 2, 2011, which is incorporated by reference for all purposes as if fully set forth herein.

BACKGROUND OF THE INVENTION

1. Field

Exemplary embodiments of the present invention relate to a thin film transistor array panel and a manufacturing method thereof. More particularly, exemplary embodiments of the present invention relate to a thin film transistor array panel and a manufacturing method thereof that is capable of forming an insulating layer made of different materials for a portion contacting an oxide semiconductor and the remaining portion without an additional process.

2. Discussion of the Background

A thin film transistor is generally used as a switching element to independently drive each pixel in a flat display device such as a liquid crystal display or an organic light emitting device. A thin film transistor array panel including the thin film transistor includes a scanning signal line (or a gate line) for transmitting a scanning signal to the thin film transistor and a data line for transmitting a data signal, as well as a pixel electrode connected to the thin film transistor.

The thin film transistor includes a gate electrode that is connected to the gate line, a source electrode that is connected to the data line, a drain electrode that is connected to the pixel electrode, and a semiconductor layer that is disposed on the gate electrode between the source electrode and drain electrode, and the data signal is transmitted to the pixel electrode from the data line according to the gate signal from the gate line.

In this case, the semiconductor layer of the thin film transistor includes polysilicon, amorphous silicon, or an oxide semiconductor.

Recently, an oxide semiconductor using a metal oxide having a low cost and high uniformity compared with polycrystalline silicon as well as high charge mobility and a high ON/OFF ratio of current compared with amorphous silicon has been researched.

When forming the semiconductor layer of the thin film transistor by using the oxide semiconductor, if the insulating layer of the portion contacting the oxide semiconductor is made of silicon nitride, the oxide semiconductor may deteriorate due to characteristics of the oxide semiconductor. Also, if the insulating layer contacting the metal layers is formed with silicon oxide, the metal layer may deteriorate.

As described above, when forming the insulating layer by using the same material at the portion contacting the oxide semiconductor and the metal layer, the characteristic of the thin film transistor may deteriorate.

The above information disclosed in this Background section is to enhance the understanding of the background of the invention and therefore it may contain information that does not form the prior art that is already known in this country to a person of ordinary skill in the art.

SUMMARY OF THE INVENTION

Exemplary embodiments of the present disclosure provide a thin film transistor array panel with an insulating layer comprising silicon oxide contacting an oxide semiconductor and an insulating layer comprising silicon nitride contacting metal layers.

Exemplary embodiments of present invention also provide a manufacturing method for a thin film transistor array panel with an insulating layer comprised of silicon oxide contacting an oxide semiconductor and an insulating layer comprised of silicon nitride contacting metal layers.

Additional features of the invention will be set forth in the description which follows, and in part will be apparent from the description, or may be learned by practice of the invention.

Exemplary embodiments of the present disclosure provide a thin film transistor array panel according to an exemplary embodiment of the present invention includes: a substrate; a gate electrode disposed on the substrate; a gate insulating layer disposed on the gate electrode; a semiconductor disposed on the gate insulating layer; a source electrode and a drain electrode disposed on the semiconductor, the source and drain electrode being spaced apart from each other; a first passivation layer disposed between the source electrode and the drain electrode on the semiconductor and made of silicon oxide; a second passivation layer disposed on the source electrode and the drain electrode and made of silicon nitride; and a pixel electrode connected to the drain electrode.

Exemplary embodiments of the present disclosure provide a method for manufacturing a thin film transistor array panel according to an exemplary embodiment of the present invention includes: forming a gate electrode on a substrate; forming a gate insulating layer on the gate electrode; forming a semiconductor on the gate insulating layer; forming a source electrode and a drain electrode on the semiconductor, the source and drain electrode being spaced apart from each other; forming a first passivation layer comprising silicon oxide between the source electrode and the drain electrode on the semiconductor; forming a second passivation layer comprising silicon nitride on the source electrode, the drain electrode, and the first passivation layer; and forming a pixel electrode connected to the drain electrode.

Exemplary embodiments of the present disclosure provide a thin film transistor including: a gate electrode; a source electrode and a drain electrode spaced apart from each other, each of the source and drain electrodes including a lower layer and an upper layer; an insulating layer disposed between the gate electrode and the source and drain electrodes; a semiconductor, the source electrode and the drain electrode being electrically connected to the semiconductor; a first passivation layer contacting the lower layer of the source and drain electrodes but not contacting the upper layer of the source and drain electrodes; and a second passivation layer disposed on the upper layer of the source and drain electrodes.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EMBODIMENTS

Figure 1:
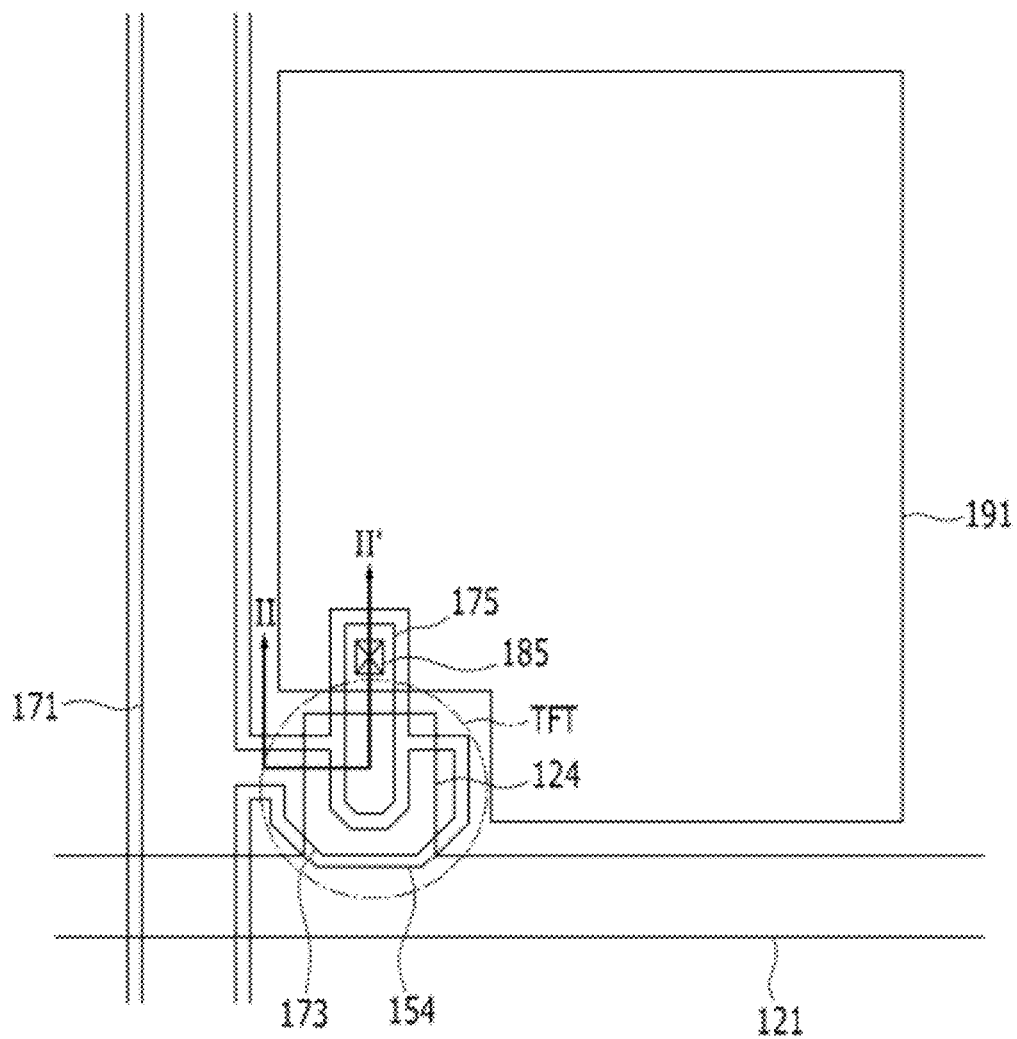
FIG. 1 is a layout view of one pixel of a thin film transistor array panel according to an exemplary embodiment of the present disclosure.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, a thin film transistor array panel according to an exemplary embodiment of the present invention will be described as follows with reference to the accompanying drawings.

Figure 2:
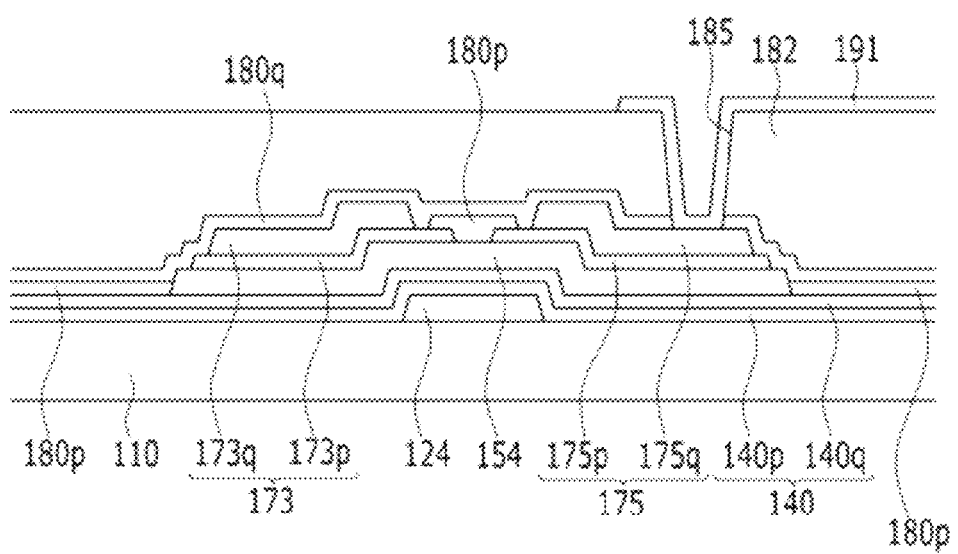
FIG. 2 is a cross-sectional view taken along the line II-II' of FIG. 1.

FIG. 1 is a layout view of one pixel of a thin film transistor array panel according to an exemplary embodiment of the present invention, and FIG. 2 is a cross-sectional view taken along the line II-II' of FIG. 1.

Referring to FIGS. 1 and 2, a thin film transistor array panel according to an exemplary embodiment of the present invention includes a substrate 110 made of glass or plastic, a gate line 121 and a data line 171 crossing with each other on the substrate 110, a thin film transistor TFT connected to the gate line 121 and the data line 171, and a pixel electrode 191 connected to the thin film transistor TFT.

A gate electrode 124 protruding from the gate line 121 is formed on the substrate 110. The gate electrode 124 is applied with a gate signal through the gate line 121.

A gate insulating layer 140 is formed on a surface of the substrate 110 including the gate line 121 and the gate electrode 124. The gate insulating layer 140 comprises a first gate insulating layer 140p including silicon nitride (SiNx) and a second gate insulating layer 140q including silicon oxide (SiOx). The first gate insulating layer 140p is formed on the gate line 121 and the gate electrode 124, and the second gate insulating layer 140q is formed on the first gate insulating layer 140p.

A semiconductor 154 is formed on the gate insulating layer 140. The semiconductor 154 may be made of an oxide semiconductor such as gallium indium zinc oxide (GIZO), zinc tin oxide (ZTO), and indium tin oxide (IZO), or a combination thereof.

A source electrode 173, protruding from the data line 171, and a drain electrode 175, spaced apart from the source electrode 173, are formed on the semiconductor 154. In an exemplary embodiment, the semiconductor 154 may be formed under the data line 171, the source electrode 173, and the drain electrode 175. The source electrode 173 may be curved with a substantially "U" shape.

The source electrode 173 and the drain electrode 175, respectively, have lower layers 173p and 175p and upper layers 173q and 175q. In the exemplary embodiment, the distance by which the upper layers 173q and 175q of the source electrode and the drain electrode are separated from each other is larger than the distance by which the lower layers 173p and 175p of the source electrode and the drain electrode are separated from each other. The lower layers 173p and 175p of the source electrode and drain electrode may include titanium (Ti). The upper layer 173q and 175q of the source electrode and the drain electrode may include copper (Cu).

A first passivation layer 180p is formed between the source electrode 173 and the drain electrode 175 on the semiconductor 154. The first passivation layer 180p may cover the semiconductor 154 exposed between the source electrode 173 and the drain electrode 175. The first passivation layer 180p may overlap the edges of the lower layers 173p and 175p of the source electrode and the drain electrode such that the semiconductor 154 may be prevented from being exposed to the atmosphere at the edges of the lower layers 173p and 175p of the source electrode and the drain electrode. In contrast, the first passivation layer 180p may not overlap the upper layers 173q and 175q of the source and drain electrode. In an exemplary embodiment, the first passivation layer 180p may be made of silicon oxide (SiOx).

A second passivation layer 180q is formed on the source electrode 173 and the drain electrode 175. The second passivation layer 180q may be formed on the substrate 110 including directly on the source electrode 173 and the drain electrode 175. The second passivation layer 180q may include silicon nitride (SiNx).

An organic insulator 182 may be further formed on the second passivation layer 180q. The first passivation layer 180p and the second passivation layer 180q may be made of an inorganic insulating material such as silicon oxide and silicon nitride. The organic insulator 182 may be thicker than the second passivation layer 180q, thereby planarizing the substrate 110.

Here, the organic insulator 182 may be a color filter. In an exemplary embodiment, the thin film transistor array panel includes a plurality of pixel areas, and the color filter may be formed in each pixel area. Also, a light blocking member may be formed at a boundary between the pixel areas.

The second passivation layer 180q and organic insulator 182 have a contact hole 185 exposing a portion of the drain electrode 175. A pixel electrode 191 is connected to the drain electrode 175 through the contact hole 185 and is formed on the organic insulator 182.

In the exemplary embodiment of the present invention, described above, the second gate insulating layer 140q and the first passivation layer 180p may be made of silicon oxide. In addition, the first gate insulating layer 140p and the second passivation layer 180q may be made of silicon nitride.

A manufacturing method of a thin film transistor array panel according to an exemplary embodiment of the present disclosure will be described as follows with reference to FIGS. 3-14.

Figure 3:
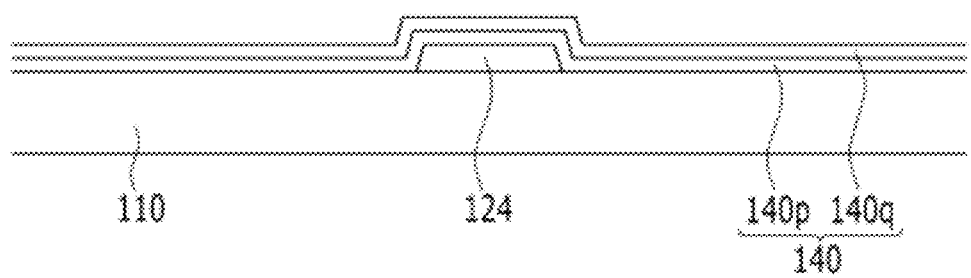
FIG. 3 is a cross-sectional view depicting a manufacturing method of a thin film transistor array panel according to an exemplary embodiment of the present disclosure.

FIG. 3 is a cross-sectional view depicting a manufacturing method of a thin film transistor array panel, as taught herein.

Referring to FIG. 3, a gate line (not shown) extending in one direction and a gate electrode 124 protruding from the gate line are formed of a metal material on substrate 110 which is made of glass or plastic.

The first gate insulating layer 140p is formed on the substrate 110 including the gate line 121 and the gate electrode 124. In an exemplary embodiment, the gate line 121 and the gate electrode 124 are made by using silicon nitride. The second gate insulating layer 140q is formed on the first gate insulating layer 140q. In an exemplary embodiment, the insulating layer 140q is made by using silicon oxide. Thus, a gate insulating layer 140 which includes first gate insulating layer 140p and the second gate insulating layer 140q is formed on the gate line 121 and the gate electrode 124.

Figure 4:
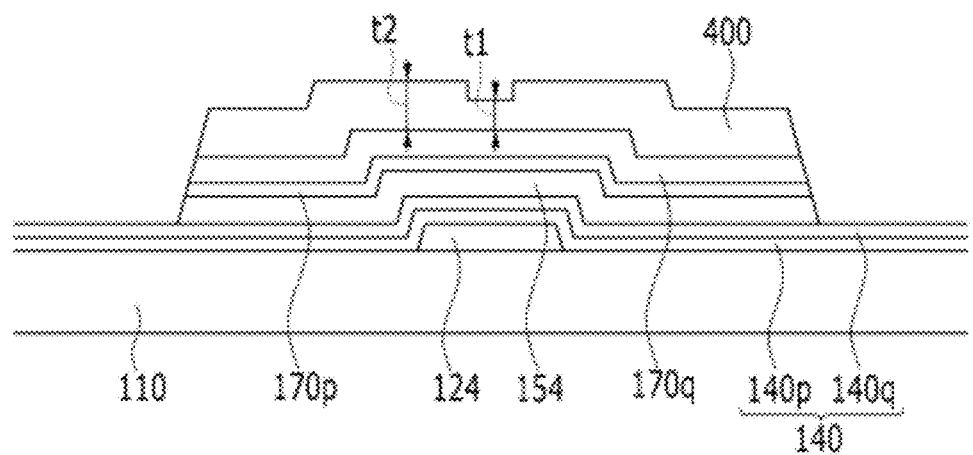
FIG. 4 is a cross-sectional view depicting a manufacturing method of a thin film transistor array panel at a semiconductor and metal deposition, as taught herein.

FIG. 4 is a cross-sectional view depicting a manufacturing method of a thin film transistor array panel at a semiconductor and metal deposition step, as taught herein.

As shown in FIG. 4, a semiconductor layer (not shown), a first metal layer (not shown), and a second metal layer (not shown) are sequentially deposited on the gate insulating layer 140. In exemplary embodiments, the semiconductor layer may be made of an oxide semiconductor such as gallium indium zinc oxide (GIZO), zinc tin oxide (ZTO), and indium tin oxide, or a combination thereof (IZO). The first metal layer may include titanium (Ti), and the second metal layer 170q may include copper (Cu).

Next, a photosensitive film (not shown) is coated on the second metal layer. The photosensitive film is patterned to form a photosensitive film pattern 400 having two or more thicknesses t1 and t2 through a photolithography process using a mask. Here, the mask used in the photolithography process may be a slit mask or a half-tone mask. The semiconductor layer (not shown), the first metal layer (not shown), and the second metal layer may then be etched using the photosensitive film pattern 400 as a mask, thereby forming a semiconductor 154, a first metal layer 170p, and a second metal layer 170q.

Figure 5:
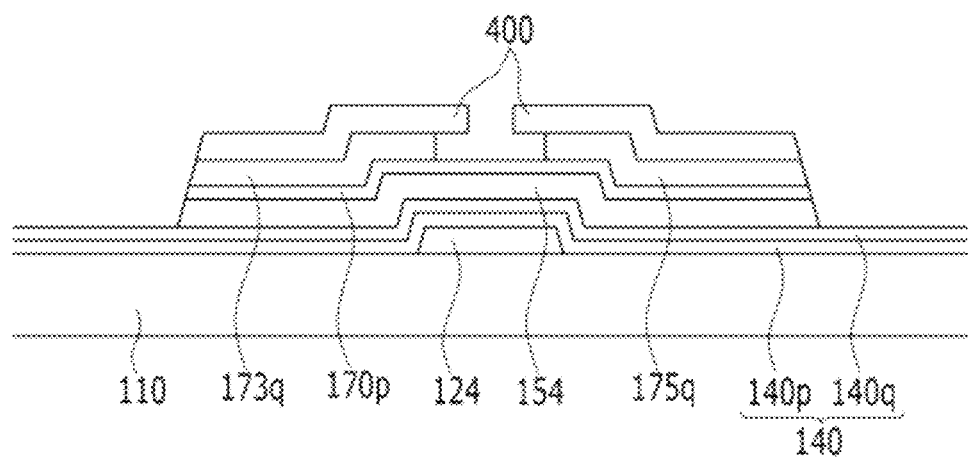
FIG. 5 is a cross-sectional view depicting a manufacturing method of a thin film transistor array panel at an etching step, as taught herein.

FIG. 5 is a cross-sectional view depicting a manufacturing method of a thin film transistor array panel at an etching step, as taught herein.

In FIG. 5, the photosensitive film 400 is ashed to remove the portion of the photosensitive film 400 having the thickness t1. Using the ashed photosensitive film pattern 400, a portion of the second metal layer 170q corresponding to the removed portion of the ashed photosensitive film pattern 400 is etched. In an exemplary embodiment, the second metal layer 170q is formed with copper (Cu) and a wet etching process is applied. Accordingly, a portion of the second metal layer 170q under the protruding edge of the ashed photosensitive film pattern 400 is also etched.

Figure 6:
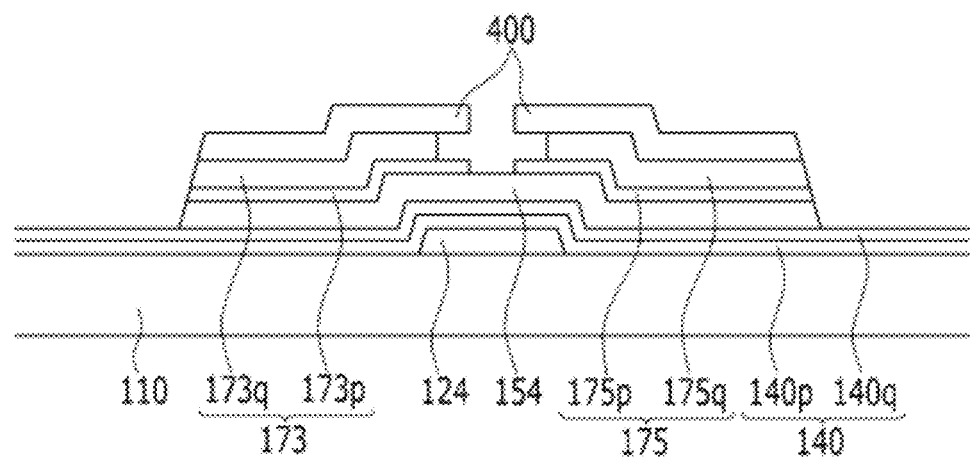
FIG. 6 is a cross-sectional view depicting a manufacturing method of a thin film transistor array panel at a second etching step, as taught herein.

FIG. 6 is a cross-sectional view depicting a manufacturing method of a thin film transistor array panel at a second etching step, as taught herein.

As shown in FIG. 6, by using the ashed photosensitive film pattern 400 as a mask, a portion of the first metal layer 170p corresponding to the removed portion of the ashed photosensitive film pattern 400 is etched. In an exemplary embodiment, the first metal layer 170p includes titanium (Ti) and a dry etching process is applied. Accordingly, in contrast to the etching of the second metal layer 170q, the first metal layer 170p is only etched in that portion below the removed portion of ashed photosensitive film pattern 400 in FIG. 5. The portion of the first metal layer 170p underneath the protruding edges of the ashed photosensitive film pattern 400 is not etched.

The source electrode 173 may be formed to be curved with a substantially "U" shape. The source electrode 173 and the drain electrode 175 are formed by patterning two metal layers such that the source electrode 173 and the drain electrode 175 are formed with lower layers 173p and 175p and upper layers 173q and 175q, respectively.

The first metal layer 170p and the second metal layer 170q are both etched by using the ashed photosensitive film pattern 400, which has the same shape. However, it will be apparent to those with skill in the art that the first metal layer 170p and the second metal layer 170q may have different shapes because of the different etching methods employed for each layer. In an exemplary embodiment, the distance which separates the upper layer 173q of the source electrode and the upper layer 175q of the drain electrode is larger than a distance which separates the lower layer 173p of the source electrode and the lower layer 175p of the drain electrode. In the exemplary embodiment, the distance between the lower layer 173p of the source electrode and the lower layer 175p of the drain electrode is the length of the channel formed in the semiconductor 154.

Figure 7:
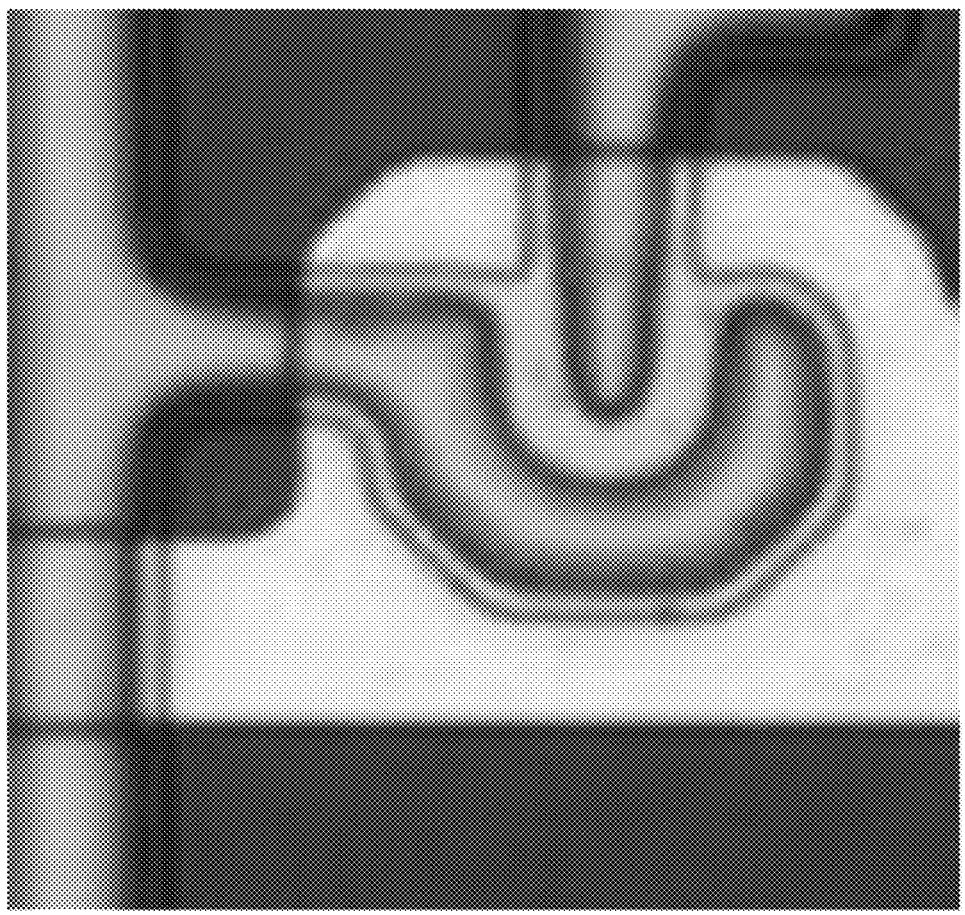
FIG. 7 is a photograph of the construction of a thin film transistor array panel as depicted in FIG. 6.

FIG. 7 is a photograph of the construction of a thin film transistor array panel as depicted in FIG. 6. Advantageously the process for forming the channel between the source electrode 173 and the drain electrode 175 as described above is executed without deterioration the semiconductor 154 or the metal layers 170p and 170q.

Figure 8:
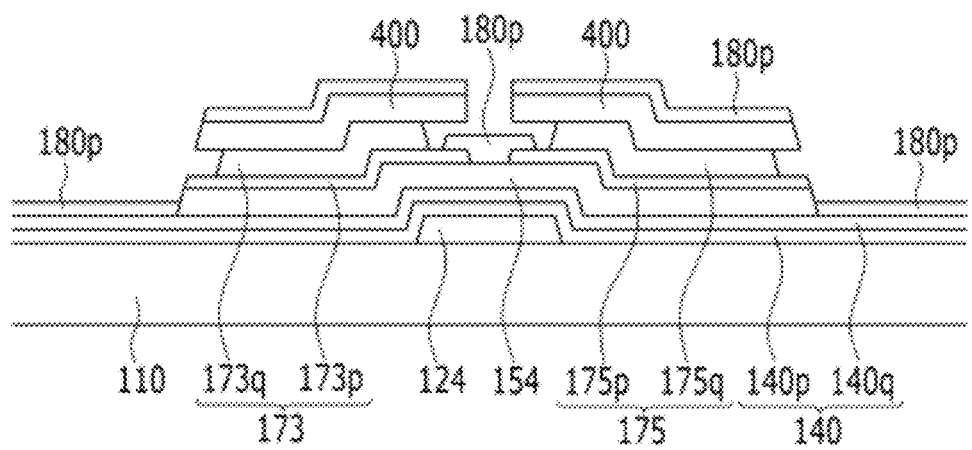
FIG. 8 is a cross-sectional view depicting a manufacturing method of a thin film transistor array panel at a first passivation layer formation step, as taught herein.

FIG. 8 is a cross-sectional view depicting a manufacturing method of a thin film transistor array panel at a first passivation layer formation step, as taught herein.

As shown in FIG. 8, the first passivation layer 180p is formed on the substrate 110 including the ashed photosensitive film pattern 400. Thus, the first passivation layer 180p is formed on the ashed photosensitive film pattern 400, the second gate insulating layer 140q and the portion of the semiconductor 154 between the source electrode 173 and the drain electrode 175. In an exemplary embodiment, the first passivation layer 180p may be formed of silicon oxide.

The first passivation layer 180p covers the exposed semiconductor 154 between the source electrode 173 and the drain electrode 175. In an exemplary embodiment, the first passivation layer 180p overlaps the edges of the lower layers 173p and 175p of the source electrode and the drain electrode such that the semiconductor 154 may be prevented from being exposed to the atmosphere at the edges of the lower layer 173p of the source electrode and the lower layer 175p of the drain electrode.

Figure 9:
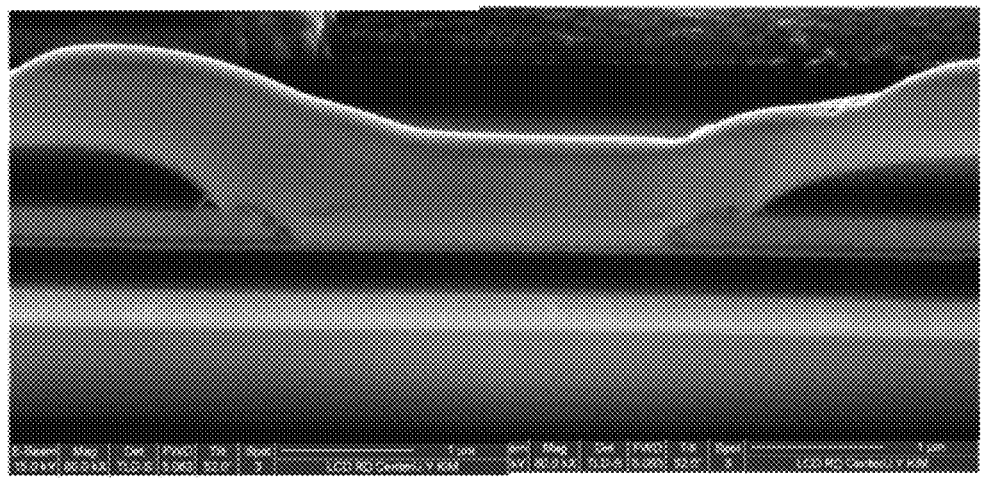
FIG. 9 is a cross-sectional photograph depicting an exemplary thin film transistor array panel manufactured as depicted in FIG. 8.

FIG. 9 is a cross-sectional photograph depicting an exemplary thin film transistor array panel manufactured as depicted in FIG. 8. As those with skill in the art will understand, FIG. 9 confirms that the first passivation layer 180p may be formed on the edges of the lower layers 173p and 175p of the source electrode and the drain electrode.

Figure 10:
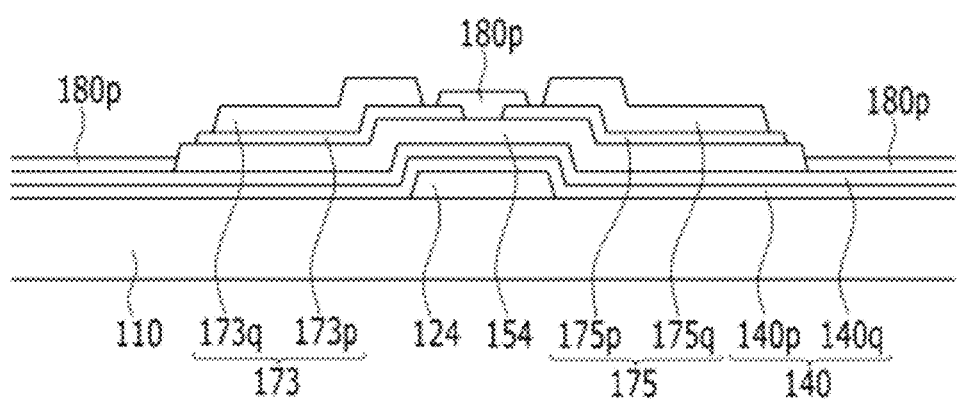
FIG. 10 is a cross-sectional view depicting a manufacturing method for a thin film transistor array panel at a first passivation layer partial removal step, as taught herein.

FIG. 10 is a cross-sectional view depicting a manufacturing method for a thin film transistor array panel at a first passivation layer partial removal step, as taught herein.

As shown in FIG. 10, the ashed photosensitive film pattern 400 is removed through a lift-off process. The first passivation layer 180p formed on the ashed photosensitive film pattern 400 is also removed therewith. Thus, the first passivation layer 180p remains between the source electrode 173 and the drain electrode 175 on the semiconductor 154 and on the second gate insulating layer 140q, but is not on the upper layer 175q of the drain electrode and the upper layer 173q of the source electrode.

Figure 11:
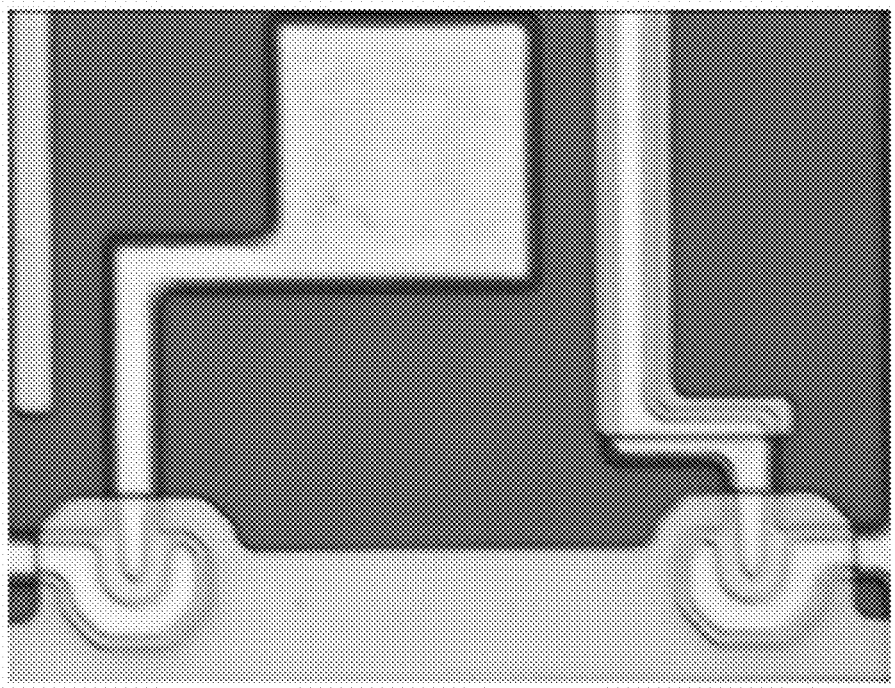
FIG. 11 is a cross-sectional photograph depicting an exemplary thin film transistor array panel manufactured as depicted in FIG. 10.
Figure 12:
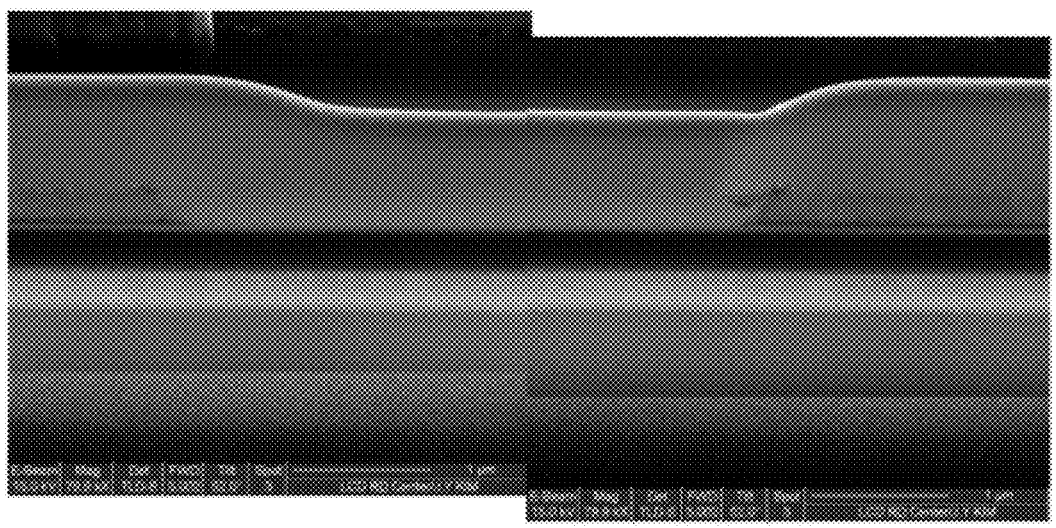
FIG. 12 is a plane photograph depicting an exemplary thin film transistor array panel manufactured as depicted in FIG. 10.

FIG. 11 is a cross-sectional photograph depicting an exemplary thin film transistor array panel manufactured as depicted in FIG. 10. FIG. 12 is a plane photograph depicting an exemplary thin film transistor array panel manufactured as depicted in FIG. 10. As those with skill in the art will understand, FIGS. 11 and 12 confirm that the first passivation layer 180p may be removed along with the ashed photosensitive film pattern 400 through the lift-off process described in relation to FIG. 10.

Figure 13:
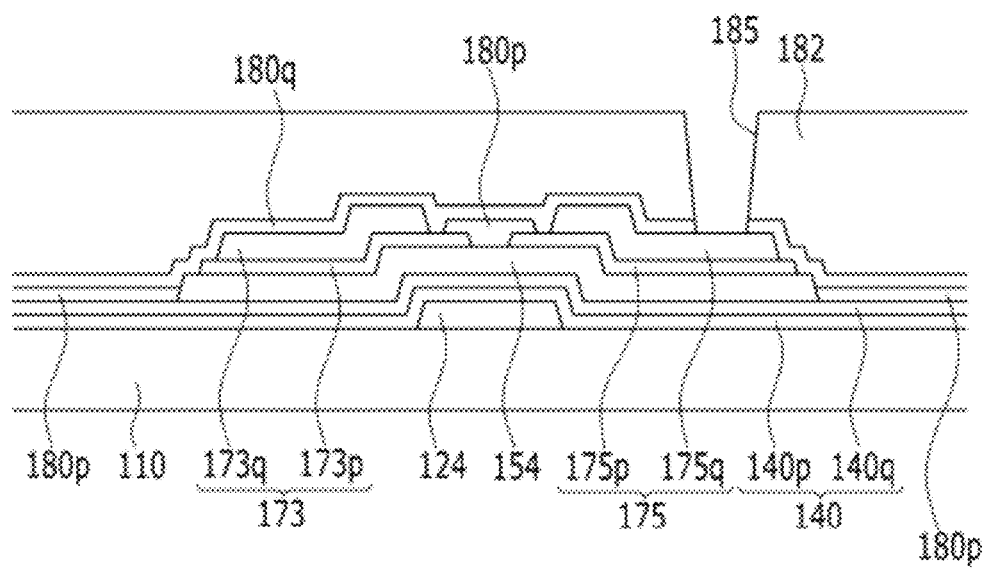
FIG. 13 is a cross-sectional view depicting a manufacturing method for a thin film transistor array panel at a second passivation layer formation step, as taught herein.

FIG. 13 is a cross-sectional view depicting a manufacturing method for a thin film transistor array panel at a second passivation layer formation step, as taught herein.

As shown in FIG. 13, the second passivation layer 180q is formed on the surface of the substrate 110 including the source electrode 173, the drain electrode 175 and the first passivation layer 180p. The second passivation layer 180q may include silicon nitride.

Next, an organic insulator 182 made of the organic insulating material is formed on the second passivation layer 180q, thereby planarizing the substrate 110. In an exemplary embodiment, the organic insulator 182 may be made of a color filter. The thin film transistor array panel includes a plurality of pixel areas, and a color filter may be formed in each pixel area. Also, a light blocking member may be formed at a boundary between the pixel areas.

Next, the organic insulator 182 and the second passivation layer 180q are patterned to form a contact hole 185 exposing a portion of the drain electrode 175.

Figure 14:
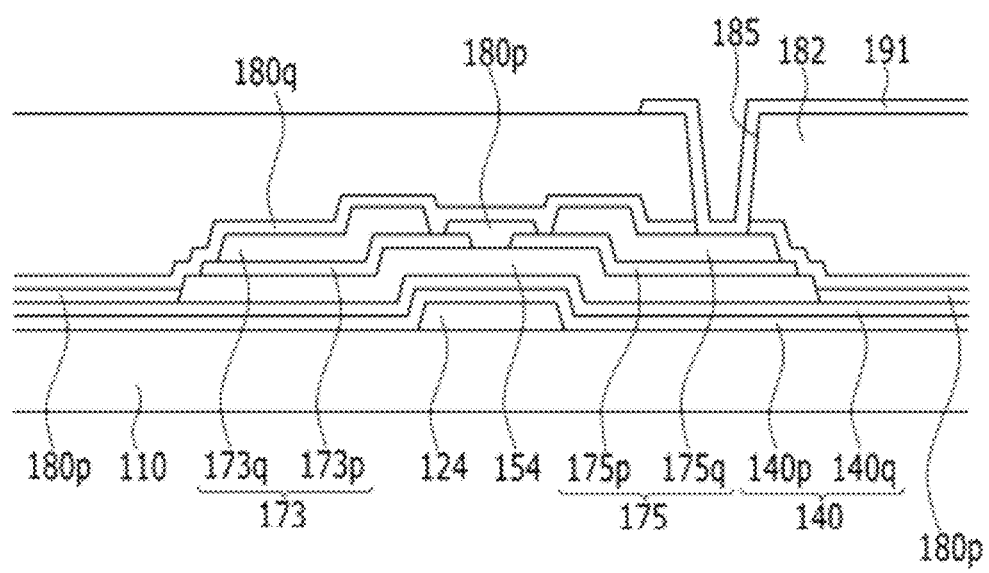
FIG. 14 is a cross-sectional view depicting a manufacturing method for a thin film transistor array panel at an electrode formation step, as taught herein.

FIG. 14 is a cross-sectional view depicting a manufacturing method for a thin film transistor array panel at an electrode formation step, as taught herein.

As shown in FIG. 14, a transparent electrode is formed on the organic insulator 182 and patterned to form a pixel electrode 191. The pixel electrode 191 is connected to the drain electrode 175 through the contact hole 185.

In the manufacturing method of the thin film transistor array panel according to an exemplary embodiment of the present disclosure, four masks are used to form the thin film transistor array panel. The photolithography process uses the first mask to form the gate electrode 124. The second mask is used to form the semiconductor 154, the source electrode 173, the drain electrode 175 and the first passivation layer 180p. The photolithography process uses the third mask to form the contact hole 185 in the second passivation layer 180q and the organic insulator 182. The fourth mask is used to form the pixel electrode 191. Advantageously, the manufacturing of the thin film transistor array panel using a total of four masks does not increase the time and costs of the photolithography progress in comparison to conventional manufacturing processes.

In an exemplary embodiment of the manufacturing method of the thin film transistor array panel, the second gate insulating layer 140q and the first passivation layer 180p may be made of silicon oxide. The first gate insulating layer 140p and the second passivation layer 180q, may be made of silicon nitride. Advantageously, in the exemplary manufacturing method of the thin film transistor array panel, the insulating layer contacting the semiconductor 154 (i.e. first passivation layer 180p) and the insulating layer contacting the metal layers 170p and 170q (i.e. the second passivation layer 180q) may be formed with different materials without the need for an additional photolithography process.

Although the exemplary embodiment of FIG. 2 includes a bottom gate thin film transistor, other thin film transistor structures are possible. For example, the thin film transistor may be a top gate thin film transistor, where the gate electrode is disposed above the source and drain electrodes in relation to the substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel comprising:
a substrate;
a gate electrode disposed on the substrate;
a gate insulating layer disposed on the gate electrode;
a semiconductor disposed on the gate insulating layer;
a source electrode and a drain electrode disposed on the semiconductor, the source electrode and drain electrode being spaced apart from each other;
a first passivation layer formed between the source electrode and the drain electrode on the semiconductor;
a second passivation layer disposed on the source electrode and the drain electrode; and
a pixel electrode connected to the drain electrode,
wherein:
the source electrode and the drain electrode each comprise a metallic lower layer and a metallic upper layer;
the first passivation layer is disposed directly on an upper surface of an edge portion of each of the lower layers; and
the second passivation layer is disposed directly on the upper layers of the source and drain electrodes.

2. The thin film transistor array panel of claim 1, wherein the first passivation layer comprises silicon oxide.

3. The thin film transistor array panel of claim 2, wherein the second passivation layer comprises silicon nitride.

4. The thin film transistor array panel of claim 3, wherein the semiconductor comprises an oxide semiconductor.

5. The thin film transistor array panel of claim 4, wherein the oxide semiconductor comprises gallium indium zinc oxide.

6. The thin film transistor array panel of claim 4, wherein the oxide semiconductor comprises zinc tin oxide.

7. The thin film transistor array panel of claim 4, wherein the oxide semiconductor comprises indium tin oxide.

8. The thin film transistor array panel of claim 4, wherein a distance between the upper layers of the source electrode and the drain electrode is larger than a distance between the lower layers of the source electrode and the drain electrode.

9. The thin film transistor array panel of claim 8, wherein the first passivation layer partially overlaps the lower layer.

10. The thin film transistor array panel of claim 8, wherein the lower layer comprises titanium (Ti), and the upper layer comprises copper (Cu).

11. The thin film transistor array panel of claim 4, wherein the gate insulating layer comprises:
a first gate insulating layer comprising silicon nitride, and
a second gate insulating layer disposed on the first gate insulating layer and comprising silicon oxide.

12. The thin film transistor array panel of claim 4, further comprising an organic insulator disposed on the second passivation layer.

13. The thin film transistor array panel of claim 12, wherein the organic insulator comprises a color filter.

14. The thin film transistor array panel of claim 4, wherein the source electrode has a substantially "U" shape.

15. The thin film transistor array panel of claim 1, wherein the first passivation layer does not contact the upper layers, and wherein the second passivation layer contacts the upper layers.

16. A method for manufacturing a thin film transistor array panel, comprising:
forming a gate electrode on a substrate;
forming a gate insulating layer on the gate electrode;
forming a semiconductor on the gate insulating layer;
forming a source electrode and a drain electrode on the semiconductor, the source electrode and drain electrode being spaced apart from each other, the source electrode and the drain electrode each comprising a metallic lower layer and a metallic upper layer;
forming a first passivation layer comprising silicon oxide between the source electrode and the drain electrode, the first passivation layer being disposed directly on an upper surface of an edge portion of each of the lower layers;
forming a second passivation layer comprising silicon nitride on the source electrode, the drain electrode, and the first passivation layer; and
forming a pixel electrode connected to the drain electrode, wherein the second passivation layer is disposed directly on the upper layers of the source and drain electrodes.

17. The method of claim 16, wherein the semiconductor comprises an oxide semiconductor.

18. The method of claim 17, wherein the oxide semiconductor comprises gallium indium zinc oxide.

19. The method of claim 17, wherein the oxide semiconductor comprises zinc tin oxide.

20. The method of claim 17, wherein the oxide semiconductor comprises indium tin oxide.

21. The method of claim 17, wherein forming the source electrode and the drain electrode comprises:
depositing a lower metal layer;
depositing an upper metal layer on the lower layer;
forming and patterning a photosensitive film on the upper metal layer;
patterning the upper metal layer, the lower metal layer, and the semiconductor by using the patterned photosensitive film as a mask;
ashing the patterned photosensitive film; and
patterning the patterned upper metal layer and the patterned lower metal layer using the ashed photosensitive film as a mask to form the source electrode and the drain electrode.

22. The method of claim 21, wherein forming the first passivation layer comprises:
forming silicon oxide on the exposed portions of the gate insulating layer, the semiconductor and the ashed photosensitive film; and
removing the ashed photosensitive film and the silicon oxide thereon.

23. The method of claim 22, wherein
the semiconductor, the source electrode, the drain electrode, and the first passivation layer are formed using a single mask.

24. The method of claim 22, wherein
the patterned upper metal layer is patterned using a wet etching process, and the patterned lower metal layer is patterned using a dry etching process such that a distance between the upper layers of the source electrode and the drain electrode is larger than a distance between the lower layers of the source electrode and the drain electrode, and
the first passivation layer overlaps a portion of the patterned lower metal layer.

25. The method of claim 24, wherein the lower metal layer comprises titanium (Ti), and the upper metal layer comprises copper (Cu).

26. The method of claim 17, wherein forming the gate insulating layer comprises:
forming silicon nitride on the substrate to form a first gate insulating layer, and
forming silicon oxide on the first gate insulating layer to form a second gate insulating layer.

27. The method of claim 17, further comprising forming an organic insulator on the second passivation layer.

28. The method of claim 16, wherein the first passivation layer does not contact the upper layers, and wherein the second passivation layer contacts the upper layers.

29. The method of claim 16, wherein the first passivation layer is not disposed on the upper layer.

30. A thin film transistor array panel comprising:
a substrate;
a gate electrode disposed on the substrate;
a gate insulating layer disposed on the gate electrode;
a semiconductor disposed on the gate insulating layer;
a source electrode and a drain electrode disposed on the semiconductor, the source electrode and drain electrode being spaced apart from each other;
a first passivation layer formed between the source electrode and the drain electrode on the semiconductor;
a second passivation layer disposed on the source electrode and the drain electrode; and
a pixel electrode connected to the drain electrode,
wherein:
the source electrode and the drain electrode each comprise a metallic lower layer and a metallic upper layer;
the first passivation layer is disposed directly on an upper surface of an edge portion of each of the lower layers; and
the first passivation layer is not disposed on the upper layer.

* * * * *